United States Patent
Yoo et al.

(10) Patent No.: US 6,835,621 B2
(45) Date of Patent: Dec. 28, 2004

(54) METHOD OF FABRICATING NON-VOLATILE MEMORY DEVICE HAVING A STRUCTURE OF SILICON-OXIDE-NITRIDE-OXIDE-SILICON

(75) Inventors: Jae-yoon Yoo, Seoul (KR); Moon-han Park, Yongin (KR); Dae-jin Kwon, Seongnam (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/455,676

(22) Filed: Jun. 5, 2003

(65) Prior Publication Data

US 2004/0009642 A1 Jan. 15, 2004

(30) Foreign Application Priority Data

Jul. 10, 2002 (KR) ................................ 10-2002-0040093

(51) Int. Cl.⁷ .......................................... H01L 21/8247
(52) U.S. Cl. ........................................ 438/261; 438/287
(58) Field of Search .............................. 438/216, 261, 438/264, 265, 287, 288, 591, 954

(56) References Cited

U.S. PATENT DOCUMENTS

| | | | |
|---|---|---|---|
| 5,877,523 A | * 3/1999 | Liang et al. | ................ 438/266 |
| 6,207,506 B1 | 3/2001 | Yi et al. | ...................... 438/264 |
| 6,458,642 B1 | * 10/2002 | Yeh et al. | .................... 438/261 |
| 6,613,658 B2 | * 9/2003 | Koyama et al. | ............. 438/591 |
| 6,673,677 B2 | * 1/2004 | Hofmann et al. | ............ 438/257 |

FOREIGN PATENT DOCUMENTS

| | | | | |
|---|---|---|---|---|
| KR | 2000-18524 | 4/2000 | | H01L/27/115 |
| KR | 2000-31796 | 6/2000 | | H01L/21/316 |
| WO | WO 02/11145 | * | 2/2002 | |

* cited by examiner

*Primary Examiner*—Chandra Chaudhari
(74) *Attorney, Agent, or Firm*—Mills & Onello LLP

(57) ABSTRACT

In a method of fabricating a non-volatile memory device with a silicon-oxide-nitride-oxide-silicon (SONOS) structure, a silicon nitride layer, which is a charge trapping layer, and a polysilicon layer, which is a control gate electrode, are electrically isolated from one another in the resulting structure. According to the method, a silicon oxide layer as a tunneling layer and a silicon nitride layer pattern as a charge trapping layer are formed on a semiconductor substrate; an oxidation process is performed to form a silicon nitride oxide layer, as a blocking layer, at top and sides of the silicon nitride layer pattern and to form a gate insulating layer at an exposed portion of the semiconductor substrate; and a control gate electrode is formed on the silicon nitride oxide layer and the gate insulating layer.

9 Claims, 3 Drawing Sheets

METHOD OF FABRICATING NON-VOLATILE MEMORY DEVICE HAVING A STRUCTURE OF SILICON-OXIDE-NITRIDE-OXIDE-SILICON

BACKGROUND OF THE INVENTION

This application claims the priority of Korean Patent Application No. 2002-40093, filed 10 Jul. 2002 in the Korean Intellectual Property Office, which is incorporated herein in its entirety by reference.

1. Field of the Invention

The present invention relates to a method of fabricating a non-volatile memory device, and more particularly, to a method of fabricating a non-volatile memory device having a structure of silicon-oxide-nitride-oxide-silicon (hereinafter, "SONOS").

2. Description of the Related Art

Semiconductor memory devices, which are used to store data, are largely classified as volatile memory devices and non-volatile memory devices. When the supply of power is removed, data stored in a volatile memory device is lost, while data stored in a non-volatile memory device is maintained. Therefore, a non-volatile memory device is particularly applicable to use in various types of appliances that are not always connected to a power source, must operate at lower power levels, and experience frequent discontinuations of supplied power, for example mobile telephone systems and memory cards for storing music and/or image data.

In general, a cell transistor of a non-volatile memory device has a stacked gate structure in which a gate insulating layer, a floating gate electrode, an insulating layer, and a control gate electrode are sequentially formed on a channel region of the cell transistor. A non-volatile memory device with a SONOS structure includes a silicon layer in which a channel region is formed, an oxide layer for forming a tunneling layer, a nitride layer acting as a blocking layer, and a silicon layer acting as a control gate electrode.

FIG. 1 is a cross-sectional view of a conventional non-volatile memory device with a SONOS structure. Referring to FIG. 1, oxide-nitride-oxide layers 110 (hereinafter, 'ONO layers 110') are formed on a semiconductor substrate 100. The semiconductor substrate 100 includes high-density impurity-doped regions 102 that are used as source or drain regions. The ONO layer 110 is a stacked structure in which a first silicon oxide layer 112 operating as a tunneling layer, a silicon nitride layer 114 operating as a charge trapping layer, and a second silicon oxide layer 116 operating as a blocking layer, are sequentially deposited. A gate insulating layer 120 is formed on a portion of the semiconductor substrate 100 between adjacent ONO layers 110. Also, a control gate electrode 130 is formed on the ONO layers 110 and the gate insulating layer 120.

To program the non-volatile memory device of FIG. 1, a positive bias voltage is applied to the control gate electrode 130 and a suitable bias voltage is applied to the impurity-doped regions 102. Then, hot electrons in the semiconductor substrate 100 are trapped into a charge trapping region of the silicon nitride layer 114, which operates as a charge trapping layer, thereby changing the threshold voltage of the cell. To erase data stored in the non-volatile memory device of FIG. 1, a negative bias voltage is applied to the control gate electrode 130 and a suitable bias voltage is applied to the impurity-doped regions 102. Then, holes in the semiconductor substrate 100 are trapped into the charge trapping region of the silicon nitride layer 114 and recombined with extra electrons that exist in the charge trapping region, thereby changing the threshold voltage of the cell.

A conventional non-volatile memory device is fabricated such that the ONO layers 110 are formed on the semiconductor substrate 100, a gate insulating layer is formed between the ONO layers 110 on the semiconductor substrate 100, and the control gate layer 130 is formed over the resultant structure.

In such a conventional non-volatile memory device, electrical short-circuiting may occur at interfaces, i.e., portions A, between the silicon nitride layer 114, which is the charge trapping layer, and the control gate electrode 130. In this case, hot electrons, which were trapped in the silicon nitride layer 114 during the programming of the non-volatile memory device, may travel into the control gate electrode 130. While erasing data in the non-volatile memory device, electrons may move to the silicon nitride layer 114 via the control gate electrode 130.

SUMMARY OF THE INVENTION

The present invention provides a non-volatile memory device with a SONOS structure, in which the interface between the control gate electrode and the charge trapping layer provides for electrical insulation therebetween.

According to one aspect of the present invention, there is provided a method of fabricating a non-volatile memory device, the method including forming a silicon oxide layer as a tunneling layer and a silicon nitride layer pattern as a charge trapping layer on a semiconductor substrate; performing an oxidation process to form a silicon nitride oxide layer, as a blocking layer, at top and side surfaces of the silicon nitride layer pattern and to form a gate insulating layer at an exposed portion of the semiconductor substrate; and forming a control gate electrode on the silicon nitride oxide layer and the gate insulating layer.

Forming the silicon oxide layer and the silicon nitride layer pattern includes forming a silicon oxide layer on the semiconductor substrate; forming a silicon nitride layer on the silicon oxide layer; forming a photoresist layer pattern on the silicon nitride layer; performing an etching process on the resultant structure using the photoresist layer pattern as an etch mask so as to sequentially etch the silicon nitride layer and the silicon oxide layer, thereby exposing a portion of the semiconductor substrate; and removing the photoresist layer pattern.

Preferably, the silicon oxide layer is formed using a thermal oxidation process, the silicon nitride layer is formed using chemical vapor deposition (CVD), and the thickness of the silicon nitride layer is thicker than a desired thickness of the charge trapping layer.

Preferably, the oxidation process is a radical oxidation process. During the oxidation process, oxygen radicals may be generated using plasma or using high-temperature wet oxidation process. Preferably, the high-temperature wet oxidation process is performed at a temperature from 500° C. to 1150° C.

BRIEF DESCRIPTION OF THE DRAWINGS

The above aspects and advantages of the present invention will become more apparent by describing in detail a preferred embodiment thereof with reference to the attached drawings in which.

DETAILED DESCRIPTION OF PREFERRED EMBODIMENTS

The present invention will now be described more fully with reference to the accompanying drawings, in which preferred embodiments of the invention are shown. This invention may, however, be embodied in many different forms and should not be construed as being limited to the embodiments set forth herein. Rather, these embodiments are provided so that this disclosure will be thorough and complete and will fully convey the concept of the invention to those skilled in the art.

FIGS. 2 through 5 are cross-sectional views illustrating a method of fabricating a non-volatile memory device with a SONOS structure, according to the present invention.

Figure 1:
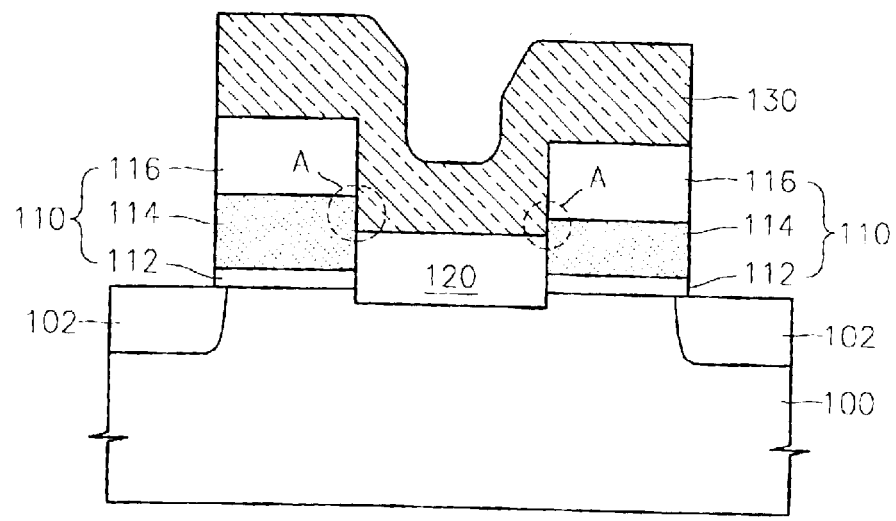
FIG. 1 is a cross-sectional view of a conventional non-volatile memory device having an SONOS structure.
Figure 2:
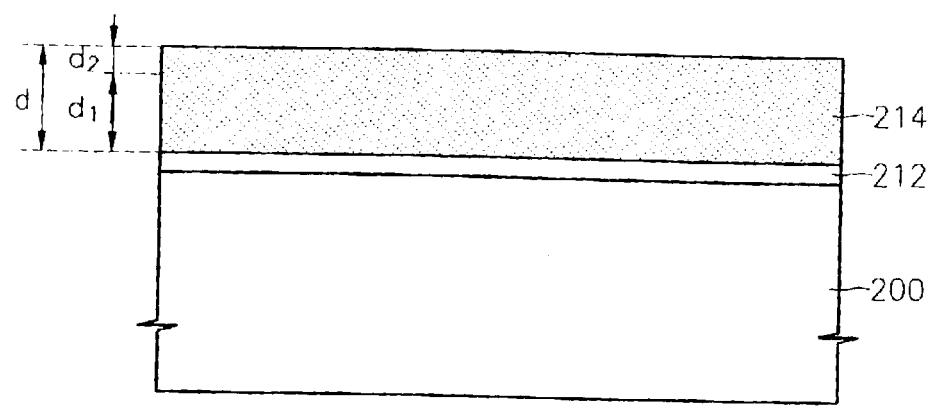
FIGS. 2 through 5 are cross-sectional views illustrating a method of fabricating a non-volatile memory device with a SONOS structure, according to the present invention.

Referring to FIG. 2, first, a silicon oxide layer 212, which operates as a tunneling layer, and a silicon nitride layer 214, which operates as a charge trapping layer, are sequentially formed on a semiconductor substrate 200. The silicon oxide layer 212 may be obtained by thermally oxidizing an upper surface of the semiconductor substrate 200. The silicon nitride layer 214 may be formed using chemical vapor deposition (CVD) to a thickness d, as illustrated in FIG. 2. The thickness d is a sum of a desired thickness $d_1$ of the charge trapping layer and an extra thickness $d_2$. Here, the extra thickness $d_2$ of the silicon nitride layer 214 will eventually become a part of a blocking layer formed between a charge trapping layer and the control gate electrode in the subsequent oxidation process.

Figure 3:
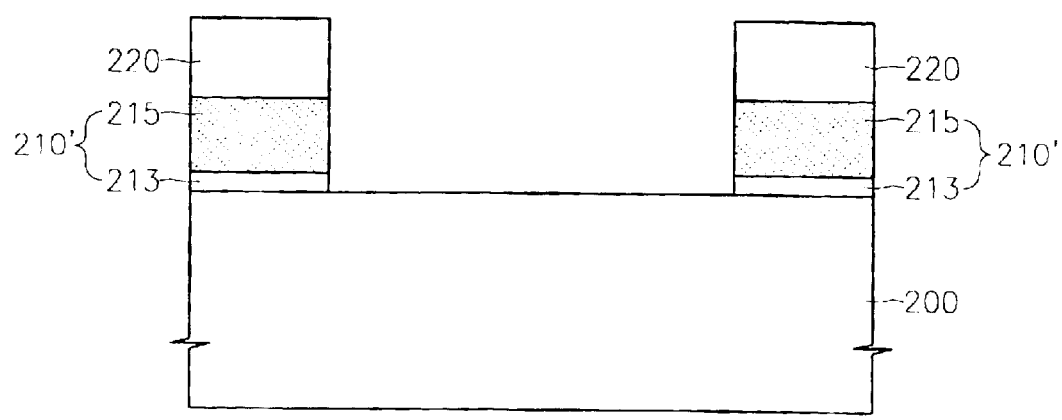

Next, referring to FIG. 3, a mask pattern such as a photoresist layer pattern 220 is formed on the silicon nitride layer 214. The photoresist layer pattern 220 has openings, through which portions of the silicon nitride layer 214 are exposed. Next, an etching process is performed on the resultant structure using the photoresist layer pattern 220 as an etching mask so as to sequentially remove the exposed portions of the silicon nitride layer 214 and the silicon oxide layer 212. As a result, portions of the semiconductor substrate 200 are exposed, and a nitride-oxide (NO) layer pattern 210', in which a silicon oxide layer pattern 213 and a silicon nitride layer pattern 215 are sequentially deposited, is formed on a portion of the semiconductor substrate 200. Here, the etching process may be a dry etching process. After the formation of the NO layer pattern 210', the photoresist layer pattern 220 is removed.

Figure 4:
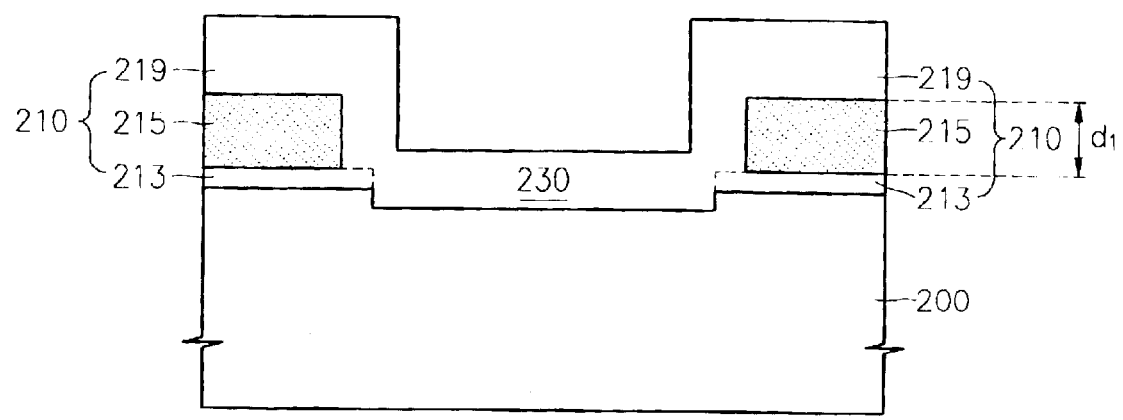

Thereafter, referring to FIG. 4, an oxidation process is performed on the resultant structure to form a silicon nitride oxide (SiON) layer 219, which operates as a blocking layer, and a silicon oxide layer 230 which operates as a gate insulating layer. During the oxidation process, a silicon nitride layer pattern 215, which operates as a charge trapping layer, of a desired thickness $d_1$, as well as the silicon nitride oxide layer 219 and the silicon oxide layer 230, are formed. The silicon nitride oxide layer 219 is formed to cover the top and sides of the silicon nitride layer pattern 215 and the silicon oxide layer 230 is formed on the semiconductor substrate 200. In the oxidation process, an ONO layer 210 in which the silicon layer pattern 213, the silicon nitride layer pattern 215, and the silicon nitride oxide layer 219 are sequentially formed, is complete.

The oxidation process may be performed using radical oxidation to oxidize the silicon nitride layer pattern 215. In detail, the oxidation process is performed by loading the semiconductor substrate 200 having the NO layer 210' into a reaction chamber and generating oxygen radicals O* in the reaction chamber. The generated O* reacts with a surface of the silicon nitride layer pattern 215 and oxidizes the surface thereof. Radical oxidation may be performed using plasma or may be performed by high-temperature wet oxidation so as to generate oxygen radical O*.

When using radical oxidation using plasma, radio-frequency (RF) power is applied to a plasma reaction chamber while inserting reaction gas containing Kr gas and $O_2$ gas into the plasma reaction chamber, in order to generate oxygen radical O* from the $O_2$ gas. Alternatively, Kr gas may be replaced with He or Ar gas and $O_2$ gas may be replaced with $O_3$ gas or $N_2O$ gas.

When using high-temperature wet oxidation, while maintaining the temperature of and pressure applied to a high-temperature reaction chamber at 500–1150° C. and 1–760 torr, respectively, reaction gas for oxidation, for example, $O_2$ gas and $H_2$ gas, is inserted into the reaction chamber to generate oxygen radical O*. The $O_2$ gas may be replaced with $O_3$ gas or $N_2O$ gas.

Figure 5:
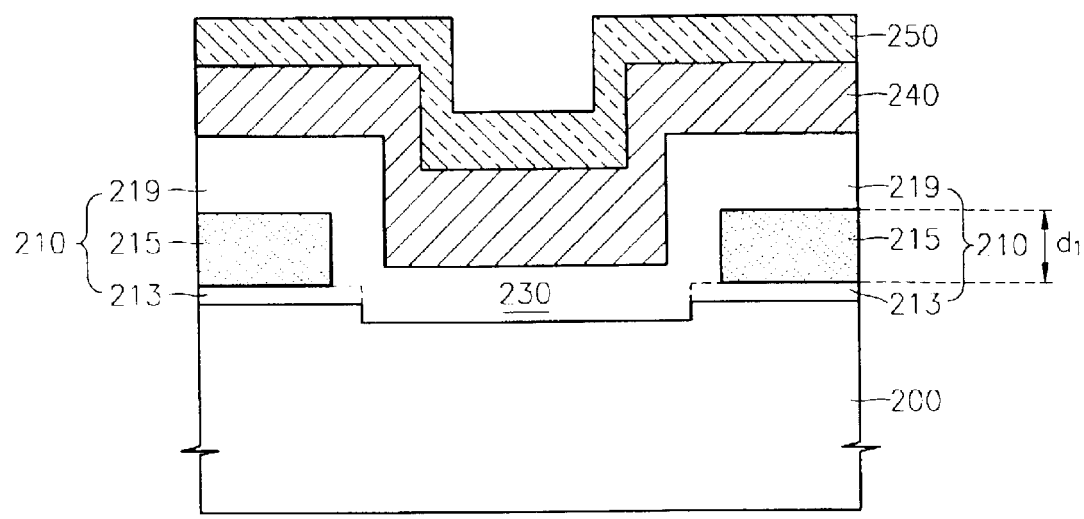

Next, referring to FIG. 5, a polysilicon layer 240 is formed as a control gate electrode on the silicon nitride oxide layer 219 and the silicon oxide layer 230. As a result, the top and sides of the silicon nitride layer 215 are covered by the silicon nitride oxide layer 219 and the polysilicon layer 240 is formed on the silicon nitride oxide layer 219, thereby electrically insulating the polysilicon layer 240 and the silicon nitride oxide layer 219. The polysilicon layer 240 may be formed using chemical vapor deposition (CVD). Also, the polysilicon layer 240 may have a higher conductivity by mixing phosphine gas and a source gas used in CVD at a ratio of 1:10 and doping the polysilicon layer 240 with phosphorus, i.e., n-type impurities. Further, in order to reduce current resistance flowing through a gate line, a metal silicide process is performed on the control gate electrode 240 to form a metal silicide layer 250.

Next, a general patterning process and an impurity-ion implantation process of forming source-drain regions in the semiconductor substrate 200 are carried out, thereby completing a non-volatile memory device with a SONOS structure.

As described above, in a method of fabricating a non-volatile memory device with a SONOS structure according to the present invention, top and sides of a silicon nitride layer, which operates as a charge trapping layer, are oxidized to form a silicon nitride oxide layer, which is a blocking layer. Also, a polysilicon layer, which operates as a control gate electrode, is formed on the silicon nitride oxide layer. Accordingly, the silicon nitride layer, which operates as a charge trapping layer, and the polysilicon layer, which operates as a control gate electrode, are electrically isolated from each other, thereby enabling stable programming of the non-volatile memory device and erasing data therefrom.

While this invention has been particularly shown and described with references to preferred embodiments thereof, it will be understood by those skilled in the art that various changes in form and details may be made herein without departing from the spirit and scope of the invention as defined by the appended claims.

What is claimed is:

1. A method of fabricating a non-volatile memory device, comprising:

forming a silicon oxide layer as a tunneling layer and a silicon nitride layer pattern as a charge trapping layer on a semiconductor substrate;

performing an oxidation process on exposed top and side surfaces of the silicon nitride layer pattern and on an exposed portion of the semiconductor substrate to form a silicon nitride oxide layer, as a blocking layer, at the top and side surfaces of the silicon nitride layer pattern and to form a gate insulating layer at the exposed portion of the semiconductor substrate; and forming a control gate electrode on the silicon nitride oxide layer and the gate insulating layer.

2. The method of claim 1, wherein forming the silicon oxide layer and the silicon nitride layer pattern comprises:

forming a silicon oxide layer on the semiconductor substrate;

forming a silicon nitride layer on the silicon oxide layer;

forming a photoresist layer pattern on the silicon nitride layer;

performing an etching process on the resultant structure using the photoresist layer pattern as an etch mask so as to sequentially etch the silicon nitride layer and the silicon oxide layer, thereby exposing a portion of the semiconductor substrate; and removing the photoresist layer pattern.

3. The method of claim 2, wherein the silicon oxide layer is formed using a thermal oxidation process.

4. The method of claim 2, wherein the silicon nitride layer is formed using chemical vapor deposition (CVD).

5. The method of claim 2, wherein the thickness of the silicon nitride layer is thicker than a desired thickness of the charge trapping layer.

6. The method of claim 1, wherein the oxidation process is a radical oxidation process.

7. The method of claim 6, wherein the radical oxidation process generates oxygen radicals using plasma.

8. The method of claim 6, wherein the radical oxidation process is a high-temperature wet oxidation process for generating oxygen radicals.

9. The method of claim 8, wherein the high-temperature wet oxidation process is performed at a temperature between 500° C. and 1150° C.

* * * * *